United States Patent
Tung et al.

(10) Patent No.: US 8,546,202 B2
(45) Date of Patent: Oct. 1, 2013

(54) MANUFACTURING METHOD FOR SEMICONDUCTOR STRUCTURES

(75) Inventors: Yu-Cheng Tung, Kaohsiung (TW); Chun-Hsien Lin, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 160 days.

(21) Appl. No.: 13/293,090

(22) Filed: Nov. 9, 2011

(65) Prior Publication Data

US 2013/0115777 A1  May 9, 2013

(51) Int. Cl.
*H01L 21/00* (2006.01)
(52) U.S. Cl.
USPC ............................................ 438/151; 438/301
(58) Field of Classification Search
USPC .................................. 438/151–166, 301–305
See application file for complete search history.

(56) References Cited

U.S. PATENT DOCUMENTS

| | | | |
|---|---|---|---|
| 5,328,810 A | 7/1994 | Lowrey et al. | |
| 6,063,688 A | 5/2000 | Doyle et al. | |
| 7,247,887 B2 | 7/2007 | King | |
| 7,470,570 B2 | 12/2008 | Beintner et al. | |
| 7,910,482 B2 * | 3/2011 | Stephens et al. | ............ 438/689 |
| 2007/0020565 A1 | 1/2007 | Koh | |
| 2007/0158756 A1 | 7/2007 | Dreeskornfeld | |
| 2008/0248429 A1 | 10/2008 | Chou | |
| 2009/0233238 A1 | 9/2009 | Hsu | |
| 2009/0258500 A1 | 10/2009 | Yang | |

* cited by examiner

*Primary Examiner* — Richard Booth
(74) *Attorney, Agent, or Firm* — Winston Hsu; Scott Margo

(57) ABSTRACT

A manufacturing method for semiconductor structures includes providing a substrate having a first region and a second region defined thereon, forming a plurality of first patterns in the first region and at least a second pattern in the second region, forming a plurality of first spacers respectively on sidewalls of the first patterns and at least a second spacer on a sidewall of the second pattern, forming a patterned protecting layer in the second region, removing the first patterns from the first region to form a plurality of first masking patterns in the first region and at least a second masking pattern in the second region, and transferring the first masking patterns and the second masking pattern to the substrate.

15 Claims, 5 Drawing Sheets

MANUFACTURING METHOD FOR SEMICONDUCTOR STRUCTURES

BACKGROUND OF THE INVENTION

1. Field of the Invention

The present invention relates to a manufacturing method for semiconductor structures, and more particularly, to a manufacturing method for semiconductor structures capable of simultaneously forming semiconductor structures having different sizes.

2. Description of the Prior Art

Conventional planar metal-oxide-semiconductor (MOS) transistor has difficulty when scaling down to 65 nm and below. Therefore the non-planar transistor technology such as Fin Field effect transistor (FinFET) technology that allows smaller size and higher performance is developed to replace the planar MOS transistor.

Please refer to FIG. 1, which is a schematic drawing of a conventional FinFET device. As shown in FIG. 1, the conventional FinFET device 100 is formed by: first a single crystalline silicon layer of a silicon-on-insulator (SOI) substrate 102 is patterned to form a fin film (not shown) in the SOI substrate 102 by proper etching process. Then, an insulating layer 104 covering the fin film is formed and followed by forming a gate 106 covering the insulating layer 104 and the fin film. Next, ion implantation and anneal treatment are performed to form a source/drain 108 in the fin film not covered by the gate 106. Since the manufacturing processes of the FinFET device 100 are easily integrated into the traditional logic device processes, it provides superior process compatibility. Furthermore, when the FinFET device 100 is formed on the SOI substrate 102 as shown in FIG. 1, traditional shallow trench isolation (STI) is no longer in need. More important, since the FinFET device 100 increases the overlapping area between the gate and the substrate, the channel region is more effectively controlled. This therefore reduces drain-induced barrier lowering (DIBL) effect and short channel effect. In addition, the channel region is longer under the same gate length, and thus the current between the source and the drain is increased.

However, the FinFET device 100 still faces many problems. For example, semiconductor structures having different sizes are formed on the substrate 102, thus to construct fine patterns (such as the fin of the FinFET device) and large patterns. However, those semiconductor structures having different sizes are formed by different processes in the prior art. Therefore, it is still in need to develop a manufacturing method for semiconductor structures having different sizes, that means a manufacturing method integrating fine patterns and large patterns is still in need.

SUMMARY OF THE INVENTION

According to an aspect of the present invention a manufacturing method for semiconductor structures is provided. The manufacturing method includes providing a substrate having a first region and a second region defined thereon, forming a plurality of first patterns in the first region and at least a second pattern in the second region, forming a plurality of first spacers on sidewalls of the first patterns and at least a second spacer on a sidewall of the second pattern, forming a patterned protecting layer in the second region, removing the first patterns from the first region to form a plurality of first masking patterns in the first region and at least a second masking pattern in the second region, and transferring the first masking patterns and the second masking pattern to the substrate to form a plurality of first semiconductor structures in the first region and at least a second semiconductor structure in the second region.

According to the manufacturing method for semiconductor structures provided by the present invention, the patterned protecting layer is formed in the second region in which the large patterns are to be formed. Thus the second masking pattern having larger width is protected during forming the first masking patterns having smaller width. After forming the first masking patterns, the first masking patterns having smaller width and the second masking pattern having larger width are simultaneously transferred to the substrate. Consequently, the first semiconductor structures having smaller size and the second semiconductor structure having larger size are simultaneously obtained. In other words, the manufacturing method for semiconductor structures provided by the present invention is able to integrate semiconductor structures having different sizes without increasing process complexity.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-9 are schematic drawings illustrating a manufacturing method for semiconductor structures provided by a first preferred embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

DETAILED DESCRIPTION

Figure 1:
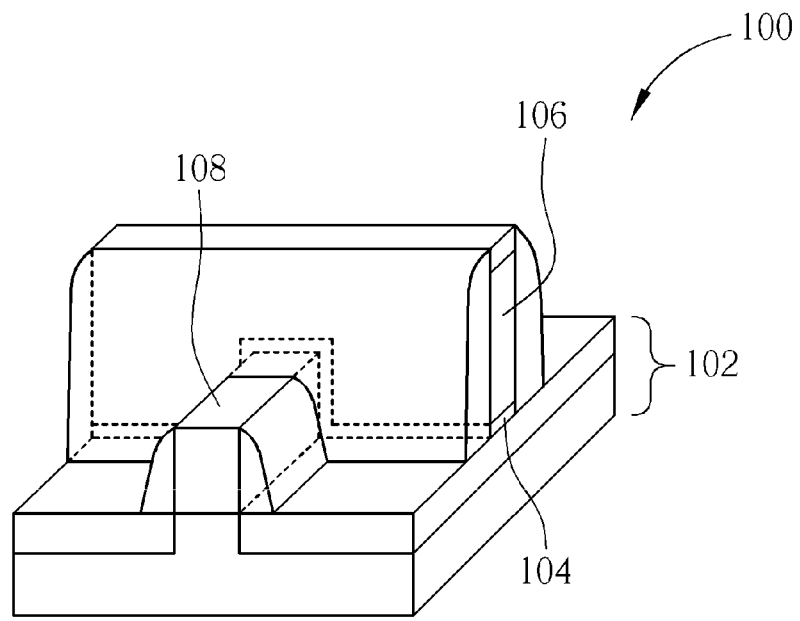
FIG. 1 is a schematic drawing of a conventional FinFET device.
Figure 2:
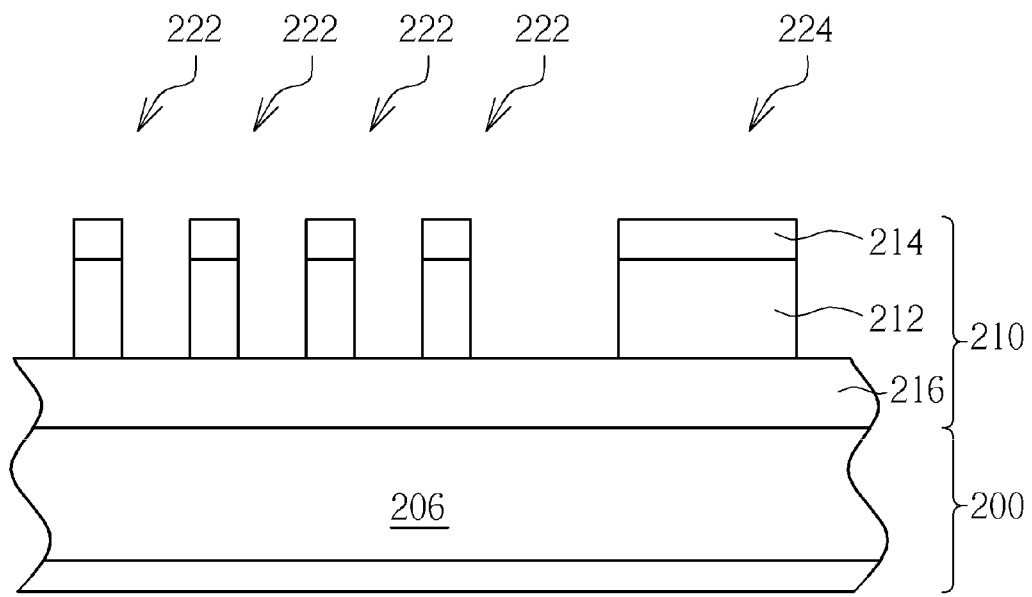

Please refer to FIGS. 2-9, which are schematic drawings illustrating a manufacturing method for semiconductor structures provided by a first preferred embodiment of the present invention. As shown in FIG. 2, the present preferred embodiment first provides a substrate 200 such as a SOI substrate or a bulk silicon substrate. The substrate 200 includes a first region 202 and a second region 204 for forming different semiconductor devices defined thereon. Furthermore, the substrate 200 includes at least a silicon-containing layer 206, for example but not limited to a single-crystal silicon layer. Subsequently, a masking layer 210 is formed on the substrate 202, particularly on the silicon-containing layer 206. The masking layer 210 can be a single-layered structure, or be a multilayer as shown in FIG. 2. The multilayer sequentially includes a first single layer 212 and second single layer 214 from bottom to top. Furthermore, the masking layer 210 preferably includes a third single layer 216 according to the present preferred embodiment. The first single layer 212 is sandwiched between the third single layer 216 and the second single layer 214. Etching rates of the first single layer 212, the second single layer 214 and the third single layer 216 are different from each other. For example, the first single layer 212 can include advanced patterning film (APF), the second single layer 214 can include silicon nitride, and the third single layer 216 can include silicon oxide, but not limited to this.

Please still refer to FIG. 2. Next, a patterned photoresist (not shown) is formed on the masking layer 210 and followed by patterning the masking layer 210. According to the preferred embodiment, the patterning step patterns only the first single layer 212 and the second single layer 214 of the masking layer 210 while the third single layer 216 remains impervious to the patterning step. After patterning the masking layer 210, a plurality of first patterns 222 is formed in the first region 202 and at least a second pattern 224 is formed in the second region 204, simultaneously. A width of the first pattern 222 and a width of the second pattern 224 can be different from each other.

Figure 3:
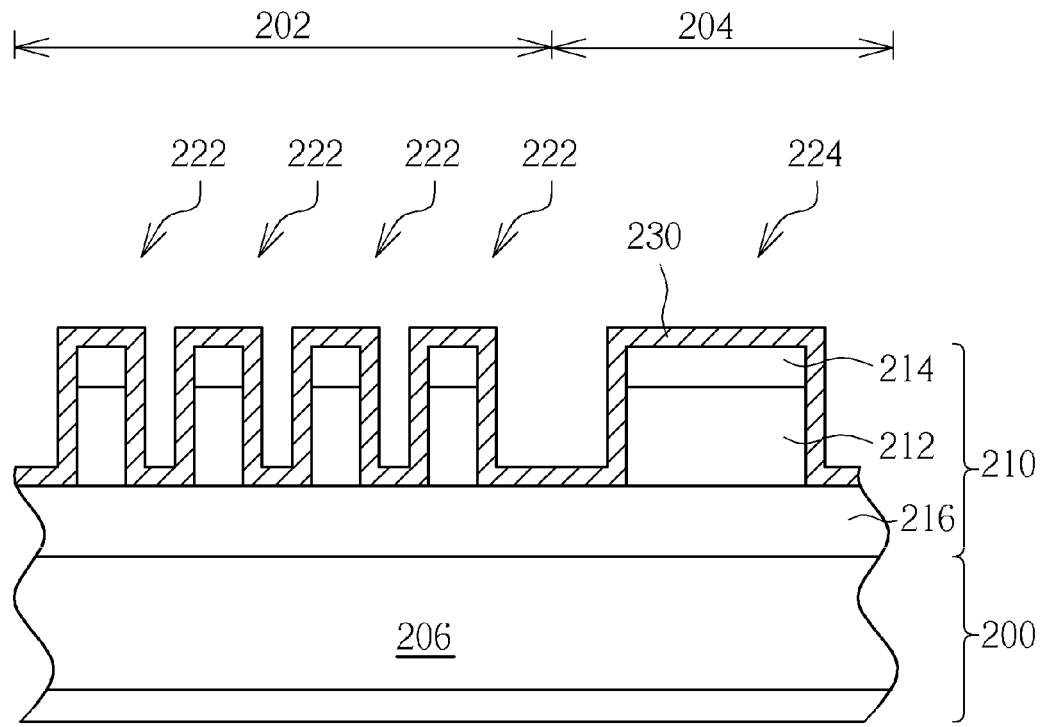

Please refer to FIG. 3. After forming the first patterns 222 and the second pattern 224, another masking layer 230 is formed on the substrate 200, particularly on the masking layer 210. The masking layer 230 covers the first patterns 222 and the second pattern 224. The masking layer 230 includes material different from or the same with the material of the second single layer 214. For example, when the second single layer 214 includes silicon nitride, the masking layer 230 can include silicon nitride, silicon oxide, or its combination. And the masking layer 230 can be a single-layered or a multi-layered structure. It is noteworthy that a thickness of the masking layer 230 can be equal to an expected width of a semiconductor structure, such as the fin of the multi-gate transistor device. For example not limited to, when a width of a fin of the multi-gate transistor device is 20 nanometer (nm), the thickness of the masking layer 230 is preferably about 20 nm.

Figure 4:
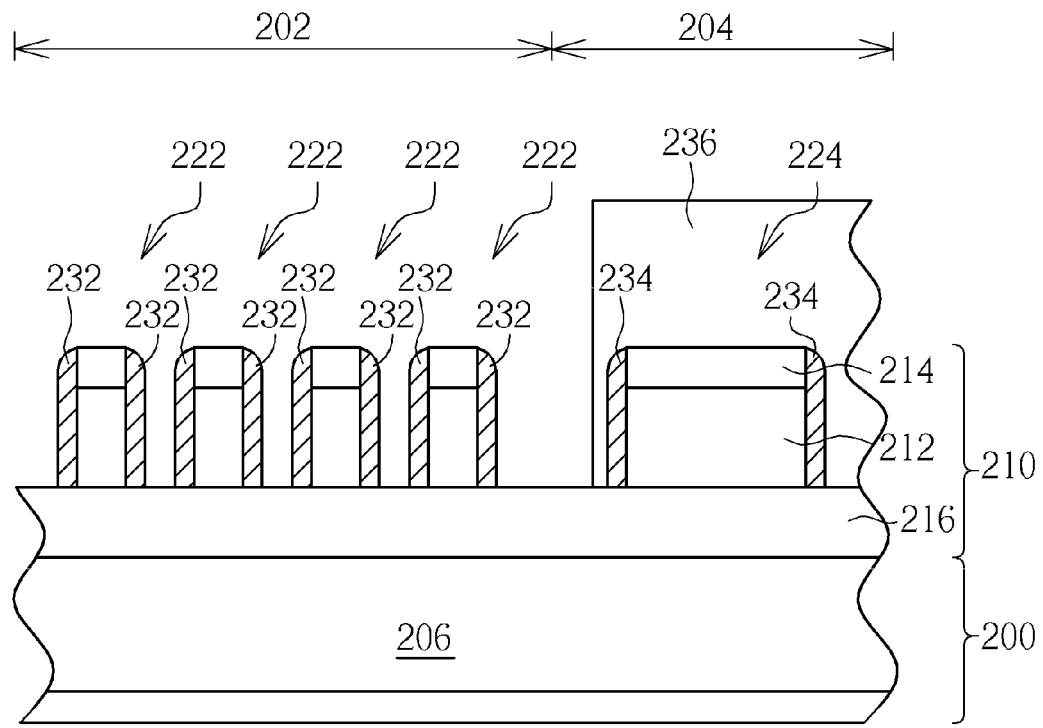

Please refer to FIG. 4. Thereafter, an etching back process is performed to remove a portion of the masking layer 230 to form a plurality of first spacers 232 on sidewalls of the first patterns 222 and at least a second spacer 234 on a sidewall of the second pattern 224. After forming the first spacers 232 and the second spacer 234, a patterned protecting layer 236 is formed in the second region 204. The patterned protecting layer 236 can include photoresist material, but not limited to this. It is also noteworthy that the patterned protecting layer 236 covers the second pattern 224 and the second spacer 234 in the second region 204.

Figure 5:
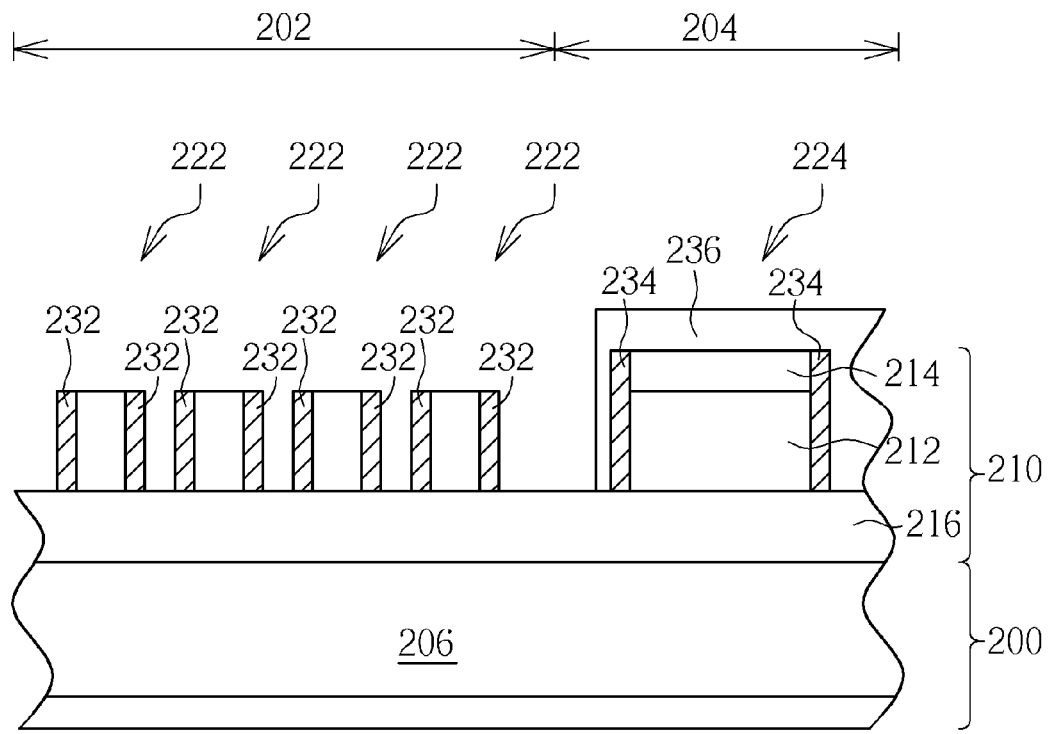

Please refer to FIG. 5. After forming the patterned protecting layer 236, the first patterns 222 are removed from the first region 202: First, the second single layer 214 of each first pattern 222 is removed. It is noteworthy that if the masking layer 230 and the second single layer 214 include the same materials, portions of the first spacers 232 in the first region 202 are consumed as shown in FIG. 5. Also, the patterned protecting layer 236 in the second region 204 is consumed during removing the first patterns 222 as shown in FIG. 5.

Figure 6:
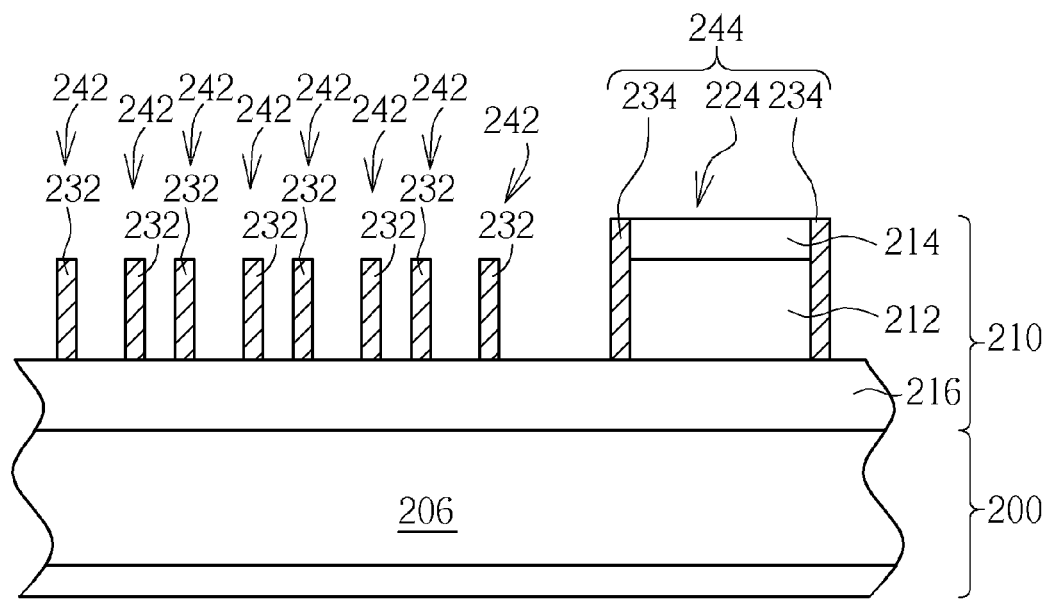

Please refer to FIG. 6. After removing the second single layer 214, the first single layer 212 is removed. Consequently, a plurality of first masking patterns 242 is formed in the first region 202. As shown in FIG. 6, each of the first masking patterns 242 comprises a first spacer 232. It is noteworthy that because the first single layer 212 includes materials different the masking layer 230, profiles of the first spacers 232 are impervious during removing the first single layer 212. After forming the first masking patterns 242, the patterned protecting layer 236 is removed and thus at least a second masking pattern 244 is formed in the second region. As shown in FIG. 6, the second masking pattern 244 includes a second pattern 224, which includes the first single layer 212 and the second single layer 214, and the second spacer 234 formed on the sidewalls of the second pattern 224. According to FIG. 6, a width of the second masking pattern 244 is different from a width of the first masking pattern 242. More particularly, the width of the second masking pattern 244 is larger than the width of the first masking patterns 242. For example, the width of the second masking pattern 244 and the width of the first masking pattern 242 includes a ratio, and the ratio is larger than 2.

Figure 7:
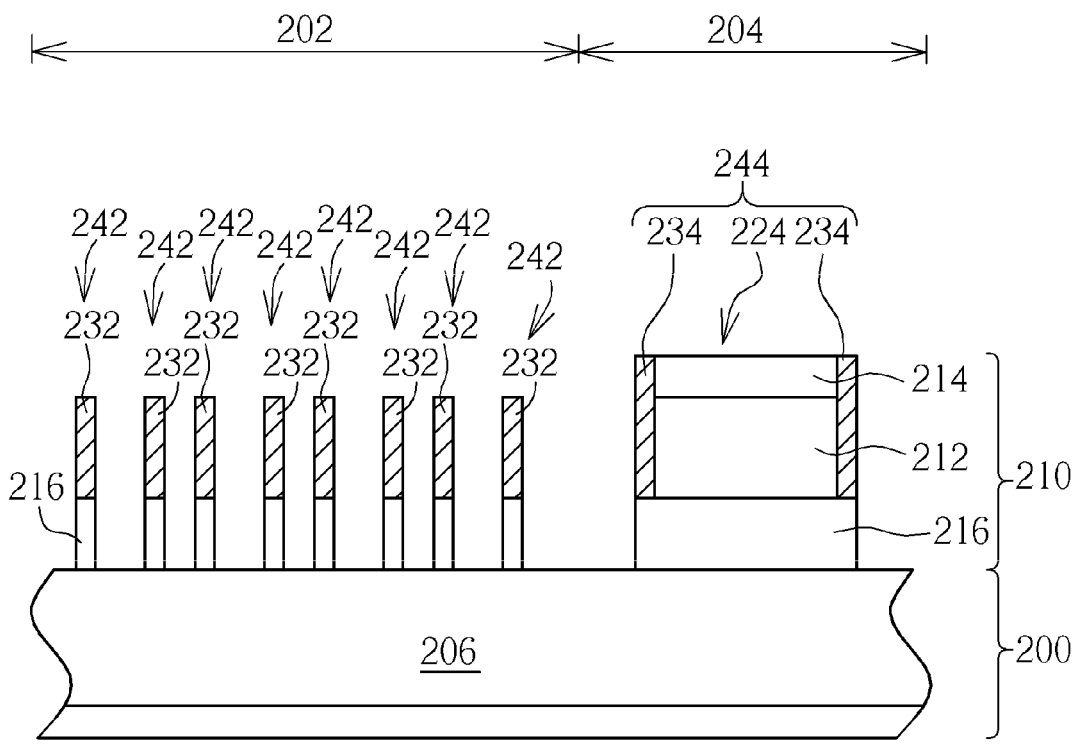

Please refer to FIG. 7. Subsequently, a first etching process is performed to transfer the first masking patterns 242 and the second masking pattern 244 to the third single layer 216. However, in a modification to the preferred embodiment that there is no third single layer 216 formed between the substrate 200 and the first single layer 212, the first masking patterns 242 and the second masking pattern 244 are directly transferred to the substrate 200, particularly to the silicon-containing layer 206 of the substrate 200 by the first etching process.

Figure 8:
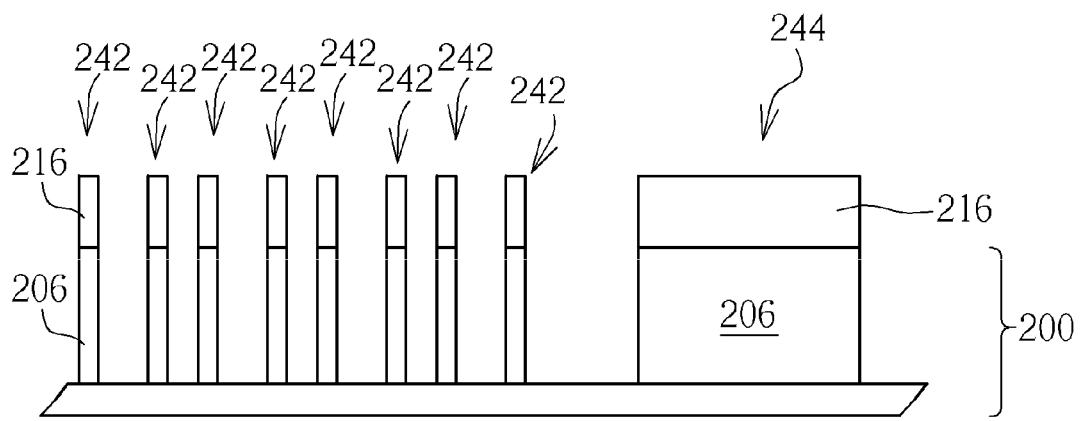
Figure 9:
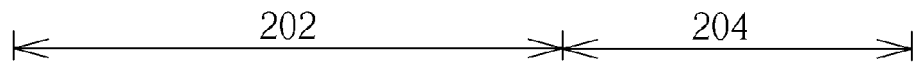
Figure 9:
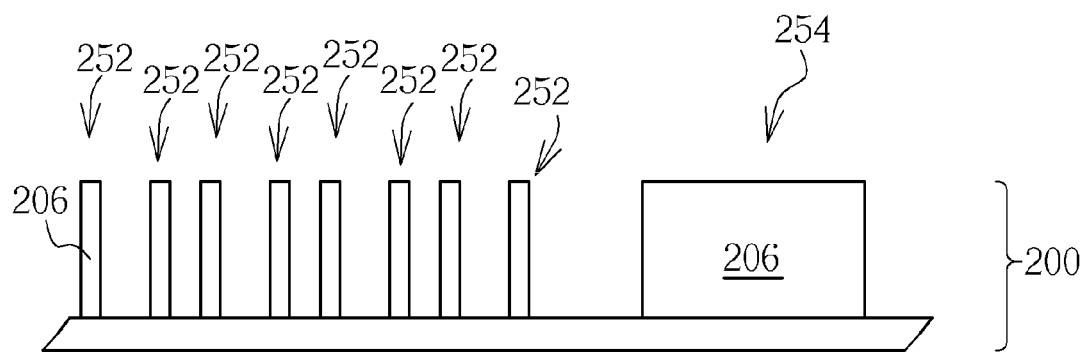

Please refer to FIGS. 8-9. Next, the first spacers 232, the second pattern 224 and the second spacer 234 are all removed and followed by performing a second etching process. Consequently, the first masking patterns 242 and the second masking pattern 244 are transferred to the substrate 200, particularly to the silicon-containing layer 206, from the third single layer 216. Therefore, a plurality of first semiconductor structures 252 and at least a second semiconductor structure 254 is formed on the substrate 200. As shown in FIG. 9, the first masking patterns 242 and the second masking pattern 244 are removed after forming the first semiconductor structures 252 and the second semiconductor structure 254. It is noteworthy that a width of the first semiconductor structure 252 is the same with the width of the first masking pattern 242, and a width of the second semiconductor structure 254 is the same with the width of the second masking pattern 244. Accordingly, the width of the first semiconductor structure 252 is inherently smaller than the width of the second semiconductor structure 254. As shown in FIG. 9, the first semiconductor structures 252 form fine patterns in the first region 202 while the second semiconductor structure 254 form a large pattern in the second region 204. The first semiconductor structures 252 and the second semiconductor structure 254 having different sizes possess different functions. For example, the first semiconductor structures 252 having smaller width serves as the fins for multi-gate transistor devices and the second semiconductor structure 254 having larger width serves as an element required by other semiconductor device.

According to the manufacturing method for semiconductor structures provided by the preferred embodiment, the patterned protecting layer 236 is formed in the second region 204 in which the large patterns are to be formed. Thus the second masking pattern 224 having the larger width is protected during forming the first masking patterns 242 having the smaller width. After forming the first masking patterns 242 and the second masking pattern 244, the first masking patterns 242 having the smaller width and the second masking pattern 244 having the larger width are simultaneously transferred to the substrate 200. Consequently, the first semiconductor structures 252 having the smaller size and the second semiconductor structure 254 having the larger size are simultaneously obtained. In other words, the manufacturing method for semiconductor structures provided by the present invention is able to integrate semiconductor structures 252/254 having different sizes without increasing process complexity.

Figure 10:
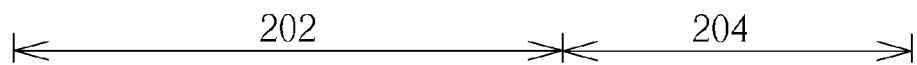
FIG. 10 is a schematic drawing illustrating a manufacturing method for semiconductor structures provided by a second preferred embodiment of the present invention.
Figure 10:
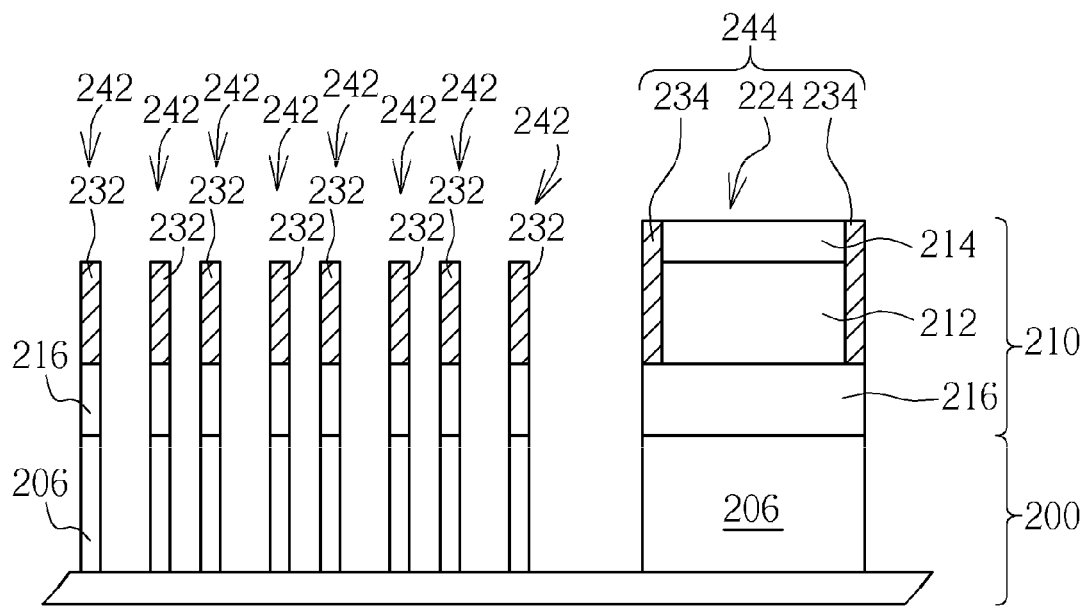

Please refer to FIG. 10, which is a schematic drawing illustrating a manufacturing method for semiconductor structures provided by a second preferred embodiment of the present invention. It is noteworthy that elements and steps the same in both of the first and second preferred embodiments are omitted in the interest of brevity. The difference between the first and second preferred embodiment is: After forming the first masking patterns 242 and the second masking pattern 244, the preferred embodiment utilizes only one etching process to transfer the first masking patterns 242 and the second masking pattern 244 to the third single layer 216 and the substrate 200, particularly to the silicon-containing layer 206 of the substrate 200. However, in a modification to the preferred embodiment that there is no third single layer 216 formed between the substrate 200 and the first single layer 212, the first masking patterns 242 and the second masking pattern 244 are directly transferred to the silicon-containing layer 206 of the substrate 200 by the first etching process.

Next, the first masking patterns 242 (including the first spacers 232), the second masking pattern 244 (including the second pattern 224 and the second spacer 234), and the third single layer 216 are removed to form a plurality of first semiconductor structures 252 and at least a second semiconductor structure 254 on the substrate 200 as shown in FIG. 9. As mentioned above, a width of the first semiconductor structure 252 is the same with the width of the first masking pattern 242, and a width of the second semiconductor structure 254 is the same with the width of the second masking pattern 244. Accordingly, the width of the first semiconductor structure 252 is inherently smaller than the width of the second semiconductor structure 254, and the first semiconductor structures 252 and the second semiconductor structure 254 having different sizes possess different functions.

According to the manufacturing method for semiconductor structures provided by the present invention, the patterned protecting layer is formed in the second region in which the large patterns are to be formed. Thus the second masking pattern having larger width is protected during forming the first masking patterns having smaller width. After forming the first masking patterns, the first masking patterns having smaller width and the second masking pattern having larger width are simultaneously transferred to the substrate. Consequently, the first semiconductor structures having smaller size and the second semiconductor structure having larger size are simultaneously obtained. In other words, the manufacturing method for semiconductor structures provided by the present invention is able to integrate semiconductor structures having different sizes without increasing process complexity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for semiconductor structures, comprising:
   providing a substrate having a first region and a second region defined thereon;
   forming a plurality of first patterns in the first region and at least a second pattern in the second region;
   forming a plurality of first spacers on sidewalls of the first patterns and at least a second spacer on a sidewall of the second pattern;
   forming a patterned protecting layer in the second region;
   removing the first patterns from the first region to form a plurality of first masking patterns in the first region and at least a second masking pattern in the second region; and
   transferring the first masking patterns and the second masking pattern to the substrate to form a plurality of first semiconductor structures in the first region and at least a second semiconductor structure in the second region.

2. The manufacturing method for semiconductor structures according to claim 1, wherein the first patterns and the second pattern comprise a multilayer.

3. The manufacturing method for semiconductor structures according to claim 2, wherein the multilayer comprises at least a first single layer and a second single layer sequentially formed on the substrate.

4. The manufacturing method for semiconductor structures according to claim 3, wherein an etching rate of the first single layer is different from an etching rate of the second single layer.

5. The manufacturing method for semiconductor structures according to claim 3, wherein the step of removing the first patterns from the first region further comprises:
   removing the second single layer from the first region; and
   removing the first single layer from the first region.

6. The manufacturing method for semiconductor structures according to claim 3, wherein the multilayer further comprises a third single layer, and the first single layer is sandwiched between the second single layer and the third single layer.

7. The manufacturing method for semiconductor structures according to claim 6, wherein an etching rate of the third single layer is different from an etching rate of the first single layer.

8. The manufacturing method for semiconductor structures according to claim 6, wherein the step of forming the first semiconductor structures and the second semiconductor structure further comprises:
   performing a first etching process to transfer the first masking patterns and the second masking pattern to the third single layer;
   performing a second etching process to transfer the first masking patterns and the second masking pattern to the substrate from the third single layer and to form the first semiconductor structures and the second semiconductor structures; and
   removing the third single layer.

9. The manufacturing method for semiconductor structures according to claim 1, where the step of forming the first spacers and the second spacer further comprises:
   forming a masking layer on the substrate, the masking layer covering the first patterns and the second pattern; and
   performing an etching back process to form the first spacers on the sidewalls of the first patterns and the second spacer on the second pattern.

10. The manufacturing method for semiconductor structures according to claim 1, wherein the first masking patterns respectively comprise a first spacer and the second masking pattern comprises the second pattern and the second spacer.

11. The manufacturing method for semiconductor structures according to claim 10, wherein a width of the second masking pattern is larger than a width of the first masking pattern.

12. The manufacturing method for semiconductor structures according to claim 11, wherein the width of the second masking pattern and the width of the first masking pattern comprise a ratio, and the ratio is equal to larger than 2.

13. The manufacturing method for semiconductor structures according to claim 1, wherein the patterned protecting layer covers the second pattern and the second spacer.

14. The manufacturing method for semiconductor structures according to claim 1, further comprises removing the patterned protecting layer after forming the first masking patterns.

15. The manufacturing method for semiconductor structures according to claim 1, further comprises removing the first masking patterns and the second masking pattern after forming the first semiconductor structures and the second semiconductor structure.

* * * * *